United States Patent
Courcy et al.

(10) Patent No.: US 7,372,391 B1
(45) Date of Patent: May 13, 2008

(54) PIPELINE ADC WITH MEMORY EFFECTS ACHIEVING ONE CYCLE ABSOLUTE OVER-RANGE RECOVERY

(75) Inventors: Matthew Courcy, Fremont, NH (US); Jipeng Li, Nashua, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/677,358

(22) Filed: Feb. 21, 2007

Related U.S. Application Data

(60) Provisional application No. 60/826,708, filed on Sep. 22, 2006.

(51) Int. Cl.
  *H03M 1/38* (2006.01)
(52) U.S. Cl. .................... 341/161; 341/155
(58) Field of Classification Search ............. 341/155, 341/161, 172; 330/258
  See application file for complete search history.

(56) References Cited

U.S. PATENT DOCUMENTS

| | | | |
|---|---|---|---|
| 6,624,698 B2 * | 9/2003 | Nagaraj ..................... | 330/258 |
| 6,731,155 B2 * | 5/2004 | Hakkarainen et al. ...... | 327/390 |
| 6,784,824 B1 * | 8/2004 | Quinn ........................ | 341/172 |
| 6,967,509 B2 * | 11/2005 | Rossi ......................... | 327/124 |
| 7,304,598 B1 * | 12/2007 | Bogner et al. .............. | 341/161 |
| 2003/0151430 A1 * | 8/2003 | Hakkarainen et al. ........ | 327/94 |

* cited by examiner

*Primary Examiner*—Peguy JeanPierre
(74) *Attorney, Agent, or Firm*—Patent Law Group LLP; Carmen C. Cook

(57) ABSTRACT

A data conversion stage circuit (104) for an opamp-shared pipeline analog-to-digital converter (ADC) (100) includes an over-range detection and recovery circuit including first and second switches (S3, S4) connected between respective input terminals (136, 137) and output terminals (138, 139) of the opamp (128) and both controlled by a first control signal, and a logic circuit (150) coupled to receive the first residue value and compare the first residue value to a pair of high and low comparison voltage levels. The logic circuit asserts the first control signal during a first clock phase when the first residue value is either greater than the high comparison voltage level or less than the low comparison voltage level. The high and low comparison voltage levels define a voltage region outside of a reference voltage range of the data conversion stage circuit where the reference voltage range defines in-range voltage values for the data conversion stage circuit.

11 Claims, 9 Drawing Sheets

PIPELINE ADC WITH MEMORY EFFECTS ACHIEVING ONE CYCLE ABSOLUTE OVER-RANGE RECOVERY

CROSS-REFERENCE TO RELATED APPLICATION

This application claims the benefit of U.S. Provisional Patent Application Ser. No. 60/826,708, filed on Sep. 22, 2006, having the same inventorship hereof, which application is incorporated herein by reference in its entirety.

FIELD OF THE INVENTION

The invention relates to pipeline analog-to-digital converters and, in particular, to a pipeline ADC with memory effects achieving one cycle absolute over-range recovery.

DESCRIPTION OF THE RELATED ART

Electronic systems have been requiring lower power solutions for converting analog signals to digital codes at high sample rates. A pipeline analog-to-digital converter (PADC) is commonly used for this task. In an attempt to lower the power consumption of PADC's, certain design techniques have been used to maximize circuit utilization to minimize power consumption. One of these methods is known as operational-amplifier sharing (opamp sharing). A PADC with opamp sharing will be referred to as an opamp shared pipeline ADC (OSPADC). Operational-amplifier sharing allows for maximum utilization of internal circuitry of the analog-to-digital converter (ADC) with lower power consumption. However, opamp sharing introduces memory and other degrading effects to the ADC system. The memory and other degrading effects often lead to undesirable behavior under extreme signal conditions.

A conventional analog to digital converter compares an input signal voltage to a fixed reference voltage range, converts the comparison to a digital word, and supplies this word as the digital output signal. Input signal voltages that exist at the bottom of the reference range are assigned a digital code equal to "0". Signals that exist at the top of the reference range are assigned a digital code equal to "$2^N-1$" where N is the number of bits of resolution of the ADC. Any input signal voltage that falls outside the range, either below the lowest reference level or above the highest reference level, will be assigned the "0" or "$2^N-1$" digital code values as well and are referred to as Over-Range Conditions (ORC's). Typical high performance electronic systems will impose a requirement that an ADC input signal is within the reference range before system functionality can be achieved. In these cases, over-range recovery is not an issue.

However, there are systems which require all in-range input signals to behave the same way whether the input signal contains over-range conditions or not. Converted samples that exist one period after an over-range condition must show no difference from the converted samples existing after an in-range conversion. This requirement is known as "one cycle absolute over-range recovery." Most conventional PADC's do not exhibit absolute over-range recovery problems. OSPADC's, on the other hand, do suffers from issues relating to absolute over-range recovery due to the memory effects of the opamp sharing.

FIG. 1 is a schematic diagram illustrating a conventional pipeline ADC architecture. Referring to FIG. 1, a conventional pipeline ADC 10 includes a sample-and-hold (SAH) stage 12 for sampling the analog input signal. Pipeline ADC 10 is made up of multiple data conversion stages 14, each stage resolving 2 output bits. The output bits from the conversion stages are coupled to a digital decode logic block 16 to generate the N-bit digital output signal. FIG. 2 is a circuit diagram illustrating a conventional 1.5-bit pipeline data conversion stage. In the traditional PADC, each conversion stage 14 includes an input capacitor network including capacitors C11, C12, C21, and C22, a stage comparator block 19 for selecting one of several reference voltages, and an opamp 18 for generating the output voltages Vout+/Vout−. The input capacitor network is operated on two clock phases φ1 and φ2 to sample the input voltages Vin+/Vin− and to couple the sampled voltages to opamp 18 for conversion.

In the traditional PADC, Opamp 18 functions only during one-half of the conversion cycle. During the other half of the conversion cycle, the opamp is being reset to its initial state. Specifically, during the first clock phase when clock φ1 is active, capacitors C11, C12, C21 and C22 sample the input signals Vin+ and Vin−. Meanwhile, switch S1 shorts nodes VA and VB together and switch S2 shorts the output voltages Vout+ and Vout− together. Opamp 18 is thus reset to a known initial state. During the second clock phase when clock φ2 is active, capacitors C12 and C22 are held in a feedback configuration around opamp 18 while capacitors C11 and C21 are connected to respective reference voltages Vref+/Vref− selected by stage comparators 19. As thus operated, the conversion stage 14 produces a residue Vout (n), for the nth stage, given by the residue transfer function as follows:

$$Vout(n) = 2 \times Vin(n) - Vref, \text{ where } Vref = +1, \quad \text{Eq. 1(a)}$$

when $Vin > 0.25 Vref$, = 0, when $-0.25 Vref < Vin < 0.25 Vref$, and = −1, when $Vin < −0.25 Vref$.

In conventional PADC 10, over-range recovery is typically not an issue because the opamp has the opportunity to become reset during each conversion cycle. Specifically, an offset voltage Vos(n) will appear between nodes VA and VB during the second clock phase (φ2) and is given as:

$$Vos(n) = \frac{Vout(n)}{A}, \quad \text{Eq. 1(b)}$$

where A is the opamp DC open-loop gain. The offset voltage is a function of the stage output voltage Vout(n) and the op-amp open-loop gain A. While the offset voltage Vos(n) remains between nodes VA and VB between the second clock phase (φ2) and the first clock phase (φ1), the opamp 18 is reset during the first clock phase (φ1) and the offset voltage Vos(n) is neutralized. Through the opamp reset operation, the ADC conversion operation remains predictable from one conversion stage to another.

FIG. 3 is a schematic diagram illustrating a conventional opamp-shared pipeline ADC architecture. Referring to FIG. 3, OSPADC 20 includes a sample-and-hold (SAH) stage 22, a series of data conversion stages 24, and a digital decode logic 26 in the same manner as PADC 10 of FIG. 1. Under the opamp-sharing scheme, each conversion stage 24 resolves two sets of bits and digital decode logic block 26 generates 2N-bit digital output signals. FIG. 4 is a circuit diagram illustrating a conventional opamp-shared 1.5-bit pipeline data conversion stage. Referring to FIG. 4, an opamp-shared conversion stage 24 includes two input capacitor networks (network A and network B) sharing a single opamp 28.

Opamp-shared conversion stage 24 operates on two clock phases φ1 and φ2 to successively resolve two sets of bits of output signals within one conversion stage. Thus, opamp 28 is being used by one network in one half of the conversion cycle to resolve one set of bits and being used by the other network in the second half of the conversion cycle to resolve the second set of bits. Each half of the conversion cycle is defined by one of clock phases φ1 and φ2 being active.

The opamp-shared conversion stage operates as follows. During the previous second clock phase (φ2), the input voltage Vin1(n) has been processed into a first residue of Vout(n,1) by network A and the first residue Vout(n,1) of network A has already been sampled by network B. Then, during the next first clock phase when clock φ1 is active, capacitors C11A, C12A, C21A and C22A of network A sample the input signal Vin1(n+1) which is the next sample of the conversion cycle. Meanwhile, capacitors C12B and C22B of network B are connected in a feedback configuration around opamp 28 and capacitors C11B and C21B are connected to respective reference voltages Vref2+/Vref2− to process the first residue Vout(n,1) from network A into a second residue of Vout(n,2) at network B. At the end of the first clock phase (φ1), opamp 28 generates output voltage Vout(n,2) being the second residue for the "nth" sample of the conversion cycle. Meanwhile, network A has sampled the next sample (n+1) onto the input capacitors.

The output voltage Vout(n,2) generated by the opamp-shared conversion stage 24 has a residue transfer function given as follows:

$$Vout(n, 2) = 2 \times Vout(n, 1) - Vref2 + \alpha Vos(n, 1), \quad \text{Eq. 2(a)}$$

where: $Vref2 = +1$, when $Vout(n, 1) > 0.25 Vref, = 0$, when $-0.25 Vref < Vout(n, 1) < 0.25 Vref, = -1$, when $Vout(n, 1) < -0.25 Vref$.

Voltage Vos(n,1) denotes the offset voltage generated by network A and αVos(n,1) represents a portion of the offset voltage being added onto the output voltage Vout(n,2), as will be described in more detail below.

During the first clock phase (φ1), an offset voltage Vos (n,2) appears between nodes VA and VB due to the operation of network B and is given as follows:

$$Vos(n, 2) = \frac{Vout(n, 2)}{A}, \quad \text{Eq. 2(b)}$$

where A is the opamp DC open-loop gain. In opamp-shared conversion stage 24, the offset voltage Vos between nodes VA and VB (36, 37) is not erased because opamp 28 does not get reset at all but instead is functional for both phases of each conversion cycle. The offset voltage Vos(n,2) will remain between nodes VA and VB at the end of the first clock phase and into the subsequently second clock phase.

During the second clock phase (φ2), capacitors C12A and C22A are connected in a feedback loop around opamp 28 while capacitors C11A and C21A are coupled to respective reference voltages Vref1+/−. Meanwhile, capacitors C11B, C12B, C21B and C22B are coupled to sample the first residue value Vout(n,1) generated by network A. During the second clock phase, a portion of the offset voltage Vos(n,2), "αVos(n,2)", is added to the capacitors of network A. As a result of connecting the capacitors of network A in a feedback loop around opamp 28 and to the reference voltages, a first residue Vout(n+1,1) is generated during the second clock phase. The first residue Vout(n+1,1) generated by the opamp-shared conversion stage 24 has a residue transfer function given as follows:

$$Vout(n + 1, 1) = 2 \times Vin1(n + 1) - Vref1 + \alpha Vos(n, 2), \quad \text{Eq. 2(c)}$$

where: $Vref1 = +1$, when $Vin(n + 1) > 0.25 Vref, = 0$, when $-0.25 Vref < Vin(n + 1) < 0.25 Vref, = -1$, when $Vin(n + 1) < -0.25 Vref$.

During the second clock phase (φ2), an offset voltage Vos(n+1,1) appears between nodes VA and VB due to the operation of network A. Offset voltage Vos(n+1,1) will add to residue Vout(n+1,2) in the same way offset voltage Vos(n,2) was added to residue Vout(n+1,1).

Thus, αVos(n,2) term in Equation 2(c) denotes a memory effect term that couples the signals between adjacent samples. The αVos(n,2) term can be minimized if the open-loop gain of the amplifier is very high, i.e., if A is very large. Thus, typical implementations of OSPADC's utilize high gain amplifiers for the opamp especially for the purpose of minimizing the offset voltage coupling between adjacent samples. However, even when very high open-loop gain amplifiers are used, the open-loop gain of these amplifiers will drop under certain operating conditions causing the offset voltage Vos(n,2) that is introduced to the next sample to be undesirably large. One of the operating conditions causing the amplifier's open-loop gain to drop is over-range conditions.

More specifically, in a high gain amplifier, the high open-loop gain response has a limited amplifier output range. The high gain range is often limited by the supply voltage and the characteristics of the devices forming the amplifier. FIG. 5A illustrates a typical transfer function of an opamp normalized to the ADC reference range. FIG. 5B illustrates the typical behavior of the open-loop gain A of an opamp over the output voltage range. As can be observed from FIGS. 5A and 5B, the gain of the opamp is high within a given range but the gain drop off rapidly outside of the range. Thus, if the residue for one conversion is outside of the high gain range, a large offset voltage Vos will get coupled back to the next sample. At each successive conversion stage, the input voltage to the stage will get progressively larger and larger, the gain of the opamp drops rapidly and large among of offset voltage is coupled back to the adjacent samples, rendering the conversion result completely incorrect.

More specifically, consider the case where first residue Vout(n,1) has an over-range condition, the second residue Vout(n,2) of the opamp during the first clock phase (φ1) will exceed the high gain range of the amplifier. The gain A of the opamp will drop, and the value of offset voltage Vos(n,2) will increase rapidly. This large offset voltage Vos(n,2) is then coupled back to the conversion of the following n+1th sample. From Eq. 2(c) above, it can be seen that the residue Vout(n+1,1) of the n+1th sample will see a voltage error due to a large offset voltage Vos(n,2). Thus, the residue for the n+1th sample will see an error based on sample "n" if sample "n" is an ORC and the open-loop gain A of the amplifier became small. If, on the other hand, sample "n" is not an ORC, and gain A remains high during the first clock phase (φ1), the offset voltage Vos(n,2) will remain small and very little error will be introduced into the residue for sample "n+1". The different results obtained with and without an over-range condition in the samples show the limitations of the over-range recovery capability of the conversion stage when opamp sharing is used.

DETAILED DESCRIPTION OF THE PREFERRED EMBODIMENTS

In accordance with the principles of the present invention, an opamp shared pipeline analog-to-digital converter (ADC) incorporates an over-range detection and recovery circuit to implement one-cycle absolute over-range recovery in the ADC. In one embodiment, the over-range detection and recovery circuit exploits the high gain region immediately outside the reference voltage range. The input voltage to the opamp is compared to an allowed over-range voltage range which forms a guardband outside the reference voltage range. If the input voltage is within the allowed over-range range, the opamp operates normally. If the input voltage exceeds the allowed over-range range, the over-range detection and recovery circuit causes the opamp to reset, thereby canceling out any offset voltage that may be present at the input terminals of the opamp. In this manner, any over-range condition occurring in one sampling cycle does not introduce a significant amount of offset voltage to the next conversion cycle. One-cycle absolute over-range recovery in an opamp-sharing pipeline ADC is realized.

Figure 6:
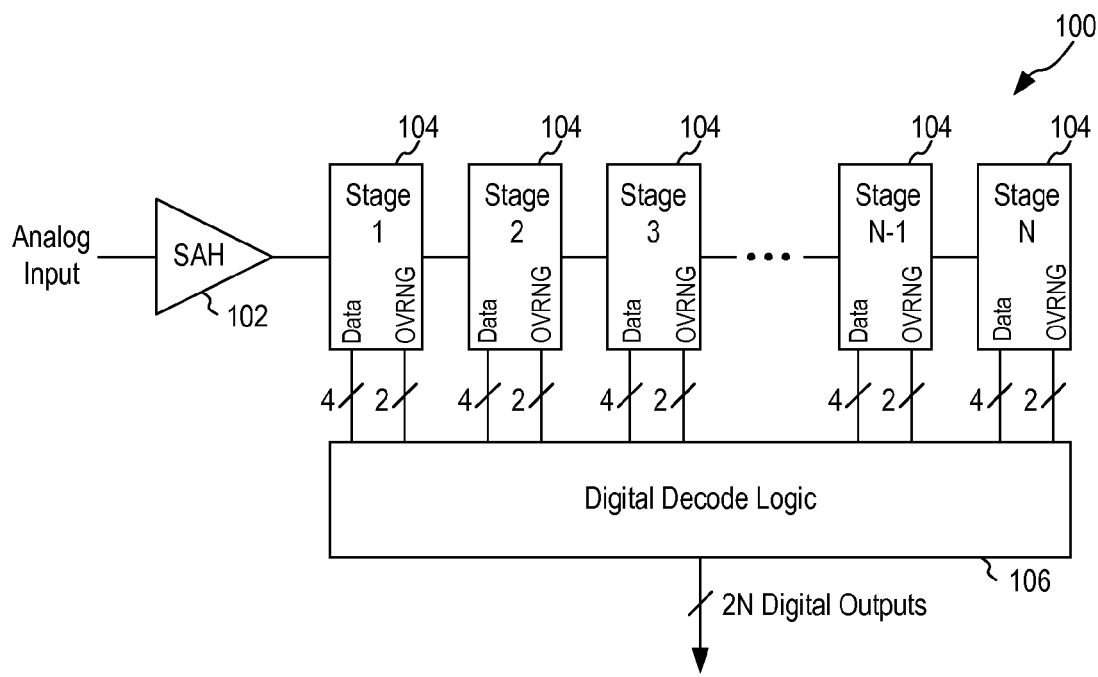
FIG. 6 is a schematic diagram illustrating an opamp-shared pipeline ADC incorporating an over-range detection and recovery circuit according to one embodiment of the present invention.

FIG. 6 is a schematic diagram illustrating an opamp-shared pipeline ADC incorporating an over-range detection and recovery circuit according to one embodiment of the present invention. Referring to FIG. 6, an opamp-shared pipeline ADC 100 includes a sample-and-hold (SAH) stage 102 for sampling the analog input signal. Opamp-shared pipeline ADC 100 is made up of multiple data conversion stages 104. Under the opamp-sharing scheme, each data conversion stage 104 resolves two set of bits of output data. In the present embodiment, each data conversion stage 104 is assumed to be an 1.5-bit stage and each stage provides two sets of 2-bit output data. Thus, 4 bits of output data are provided at each conversion stage. Opamp-shared pipeline ADC 100 also includes a digital decode logic block 106 generating 2N-bit digital output signals.

In opamp-shared pipeline ADC 100, each conversion stage 104 implements the over-range detection and recovery scheme in accordance with the present invention. In addition to providing the output data signals, each conversion stage also provides an over-range indicator OVRNG signal. In the present embodiment, the OVRNG signal is a two-bit signal and is generated to inform the digital decode logic block 106 when a sample has an over-range condition. The sample having the over-range condition is set to high or low. In this manner, each conversion stage 104 operates to detect any over-range conditions and initiates recovery operations while the occurrence of over-range conditions is indicated to digital decode logic block. By setting the over-ranged signal to high or low ensures that the pipeline is clean and free from erroneous voltage values. Digital decode logic block 106 can disregard samples that suffer from the over-range conditions when generating the digital output signals. Thus, over-range conditions at one or more samples do not affect the entire conversion pipeline.

Figure 7A:
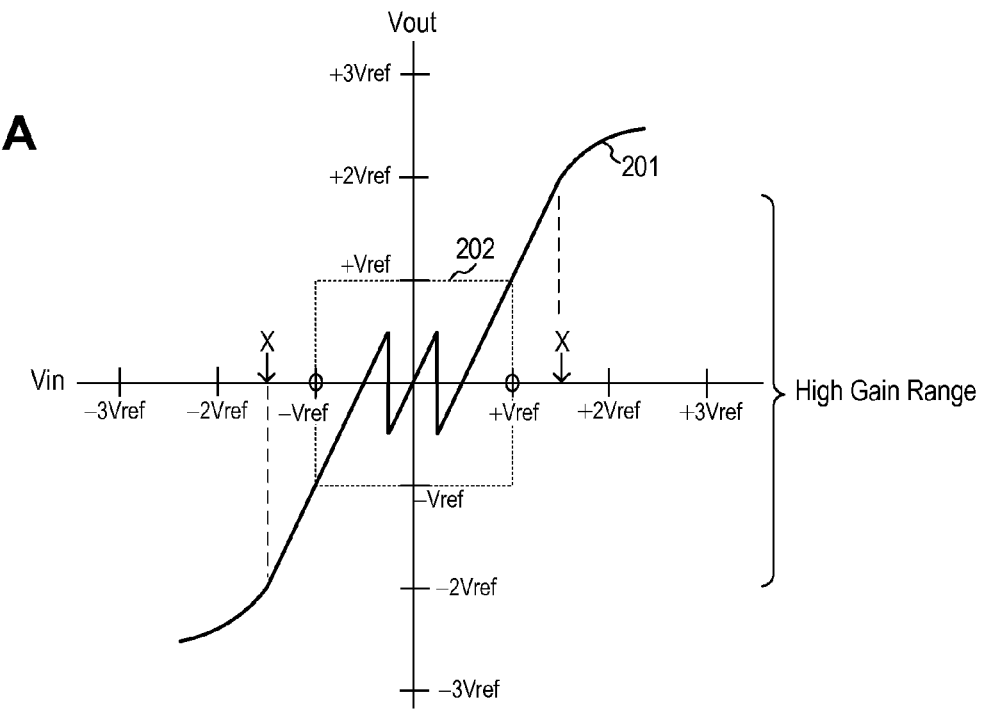
FIG. 7A is a graph illustrating the behavior of the residue (Vout) as a function the input voltage (Vin) of a conventional data conversion stage when the opamp has a limited high gain range.

The over-range detection and recovery scheme of the present invention exploits the high open-loop gain range (high gain range) existing outside the reference voltage range of the ADC. In the present description, the reference voltage range refers to voltages values that are within the reference voltage levels of the ADC and are therefore the permissible in-range voltage values for the ADC. Voltage values outside of the reference voltage range are considered over-range conditions. FIG. 7A is a graph illustrating the behavior of the residue (Vout) as a function the input voltage (Vin) of a conventional data conversion stage when the opamp has a limited high gain range. The high gain range of the opamp is indicated by the bracket in FIG. 7A. The portion of the curve 201 that is contained within the dashed box 202 represents the 1.5-bit stage transfer function for in-range signals. The in-range signal region for the input voltage is denoted by the "O" marks. It can be observed that the high gain range of the opamp extends outsides of the in-range signal region (box 202). That is, curve 201 remains straight outside of the in-range signal region (box 202) until the input voltage values exceed a level indicated by the "X" marks. Beyond the "X" marks, the gain of the opamp starts to drop off and the response curve 201 is no longer linear.

Figure 7B:
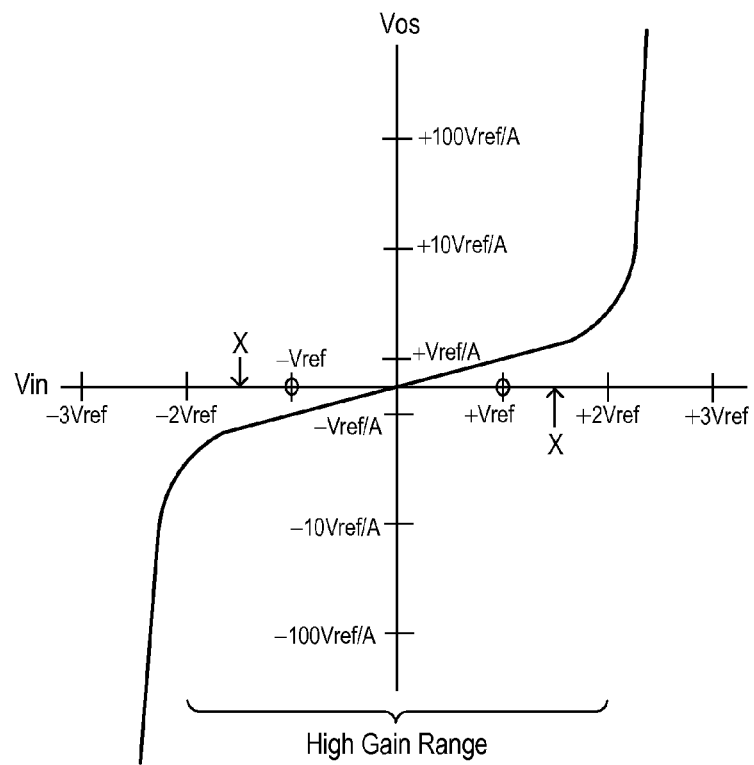
FIG. 7B is a graph illustrating the behavior of the offset voltage Vos of an opamp as a function of the input voltage (Vin).

FIG. 7B is a graph illustrating the behavior of the offset voltage Vos of an opamp as a function of the input voltage (Vin). For input voltage values that are within the in-range signal region denoted by the "O" marks, the offset voltage is insignificant as the opamp is operated within the high gain range. The offset voltage does not increase substantially outside the in-range signal region until the input voltage values exceed the level indicated by the "X" marks as the high gain range extends beyond the in-range signal region. For voltage values beyond the "X" marks, the gain of the opamp drops off rapidly and the value of the offset voltage increases rapidly.

The over-range detection and recovery scheme of the present invention exploits the extended high gain range of the opamp beyond the in-range signal region to detect for and respond to over-range conditions. More specifically, the over-range detection and recovery scheme operates by selecting a pair of trip points beyond the in-range signal region but within the high gain range of the opamp. Input signals that fall within the trip point region will be allowed to be converted as normal. Input signals that fall outside of the trip point region will cause the opamp to be reset to remove the offset voltages.

Figure 8A:
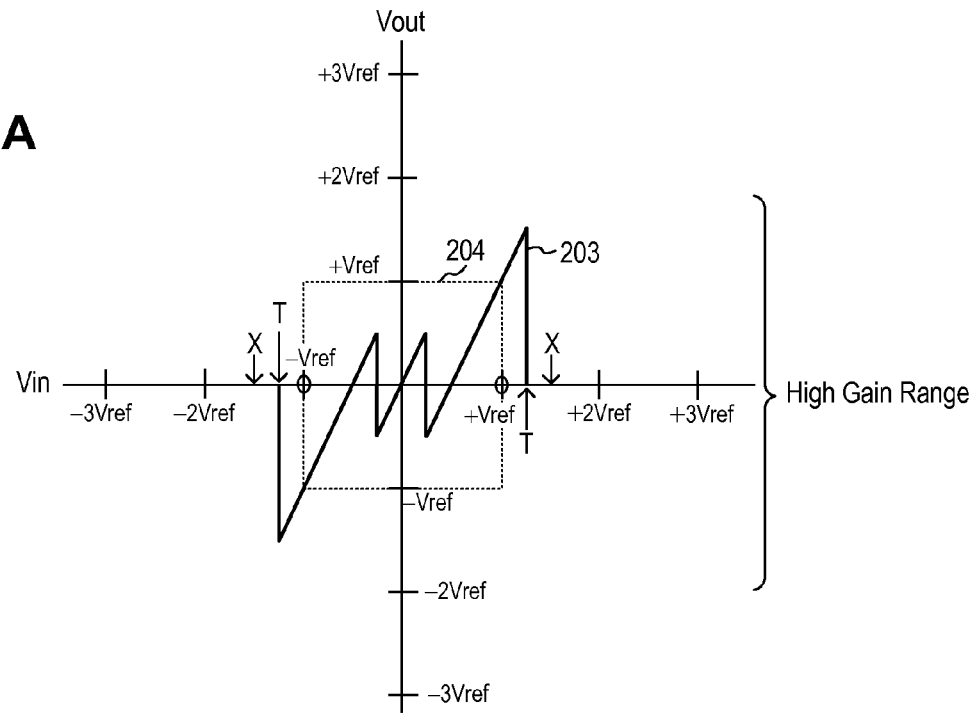
FIG. 8A is a graph illustrating the behavior of the residue (Vout) as a function the input voltage (Vin) of a data conversion stage implementing the over-range detection and recovery scheme according to one embodiment of the present invention.

FIG. 8A is a graph illustrating the behavior of the residue (Vout) as a function of the input voltage (Vin) of a data conversion stage implementing the over-range detection and recovery scheme according to one embodiment of the present invention. Referring to FIG. 8A, a pair of trip points, denoted by "T" marks, are selected to be outside of the in-range voltage region (box 204) but inside the high gain range ("X" marks). The pair of trip points define an allowed over-range voltage range ("allowed over-range region"). The input voltage is compared against the trip point voltage levels to detect an over-range condition. When the input voltage exceeds the in-range region but is within the allowed over-range region (denoted by the "T" marks), the input voltage is allowed to be converted as normal. When the input voltage is equal to or exceeds the allowed over-range region, the over-range detection and recovery scheme will cause the opamp to be reset so that the output voltage Vout is zeroed out, as shown in FIG. 8A.

Figure 8B:
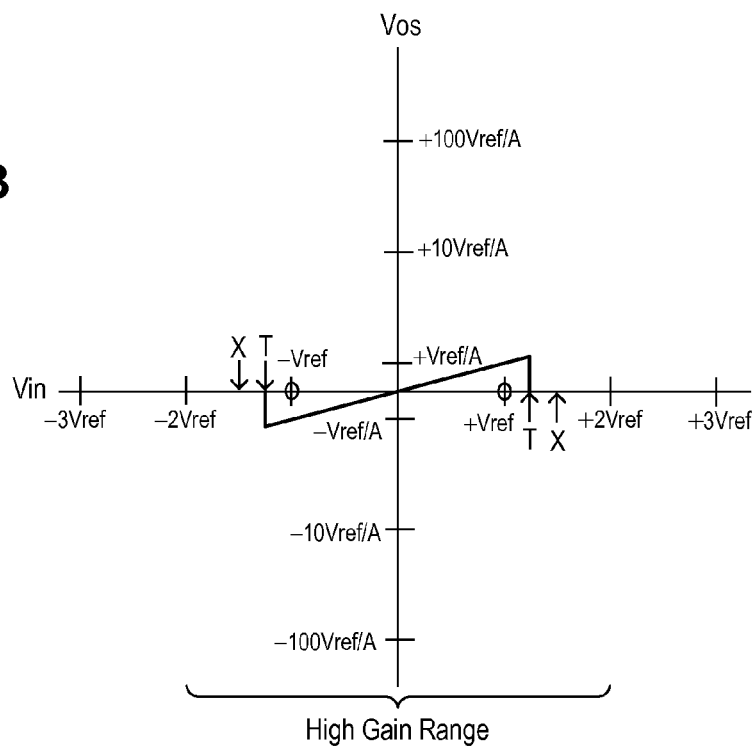
FIG. 8B is a graph illustrating the behavior of the offset voltage Vos at the opamp as a function of the input voltage (Vin) in a data conversion stage implementing the over-range detection and recovery scheme according to one embodiment of the present invention.

FIG. 8B is a graph illustrating the behavior of the offset voltage Vos at the opamp as a function of the input voltage (Vin) in a data conversion stage implementing the over-range detection and recovery scheme according to one embodiment of the present invention. Referring to FIG. 8B, when the over-range detection and recovery scheme is implemented, the offset voltage Vos is zeroed out for input voltages equal to or exceeding the allowed over-range region by resetting the opamp. In this manner, the offset voltage Vos appearing at the input terminals of the opamp is limited to insignificant values within the allowed over-range region and the in-range signal region, as shown in FIG. 8B.

To ensure that the over-range detection and recovery scheme does not interfere with the ADC operation, the voltage values selected for the trip points should be as close to the reference voltages (+/−Vref) as possible but should remain outside of the reference voltage range. If the trip point falls within the reference voltage range, the ADC conversion will lose digital codes associated with the high end of the reference range and the ADC performance will become compromised. Comparator offset voltages that are inherent in the comparators used for the over-range detection limit how close the trip points can be placed relative to the reference voltages (+/−Vref). In one embodiment, the trip points are selected at voltage values that are outside of the reference voltage range by a nominal value. In this manner, non-linearities in the comparator circuitry resulting in comparator offset voltages will not cause the trip point voltage levels to drop within the reference voltage region.

According to one embodiment of the present invention, the over-range detection and recovery scheme is implemented at every data conversion stage. In this manner, an over-range condition existing at one conversions stage that is within the allowed over-range region will be amplified by the subsequent data conversion stages. When the sample finally exceeds the allowed over-range region, the over-range condition will be detected and corrected at a subsequent data conversion stage. When the over-range detection and recovery is implemented in all data conversion stages, the effective trip point for the entire ADC becomes the voltage value of the trip point divided by the entire system gain (typically $2^N$ for an N bit pipeline). The effective trip point is very close to the reference voltage Vref and hence, providing very reliable protection of the ADC.

Figure 1:
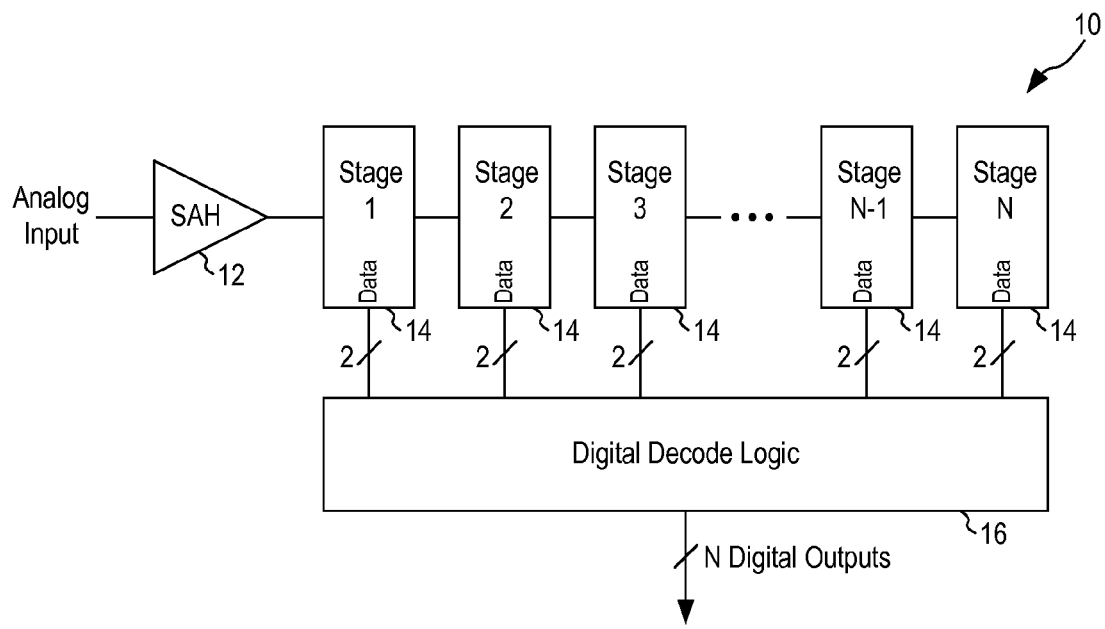
FIG. 1 is a schematic diagram illustrating a conventional pipeline ADC architecture.
Figure 3:
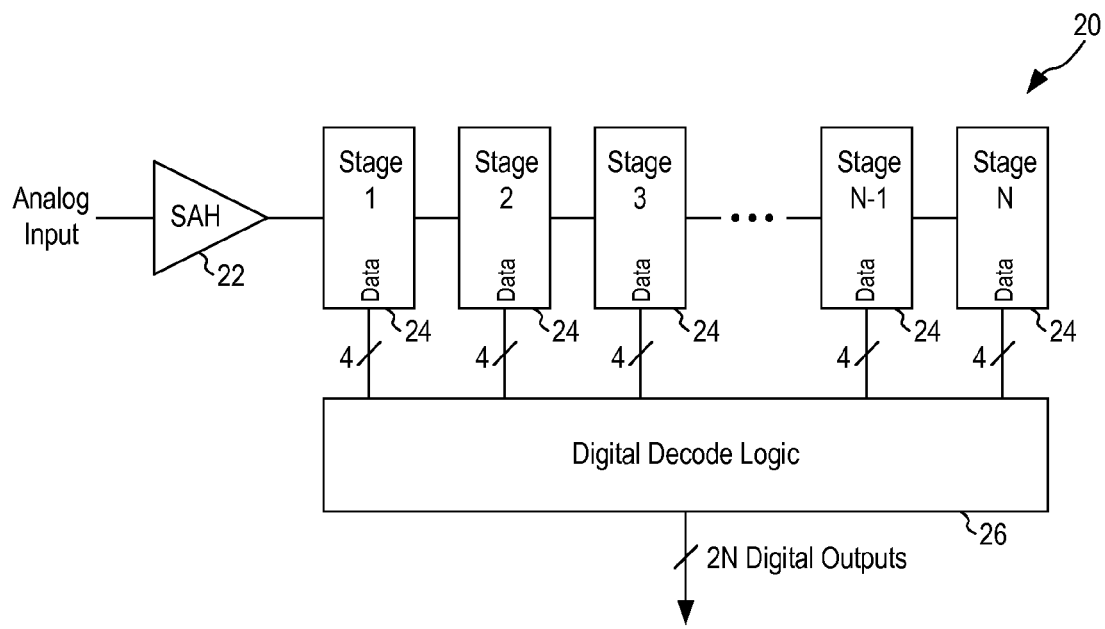
FIG. 3 is a schematic diagram illustrating a conventional opamp-shared pipeline ADC architecture.
Figure 2:
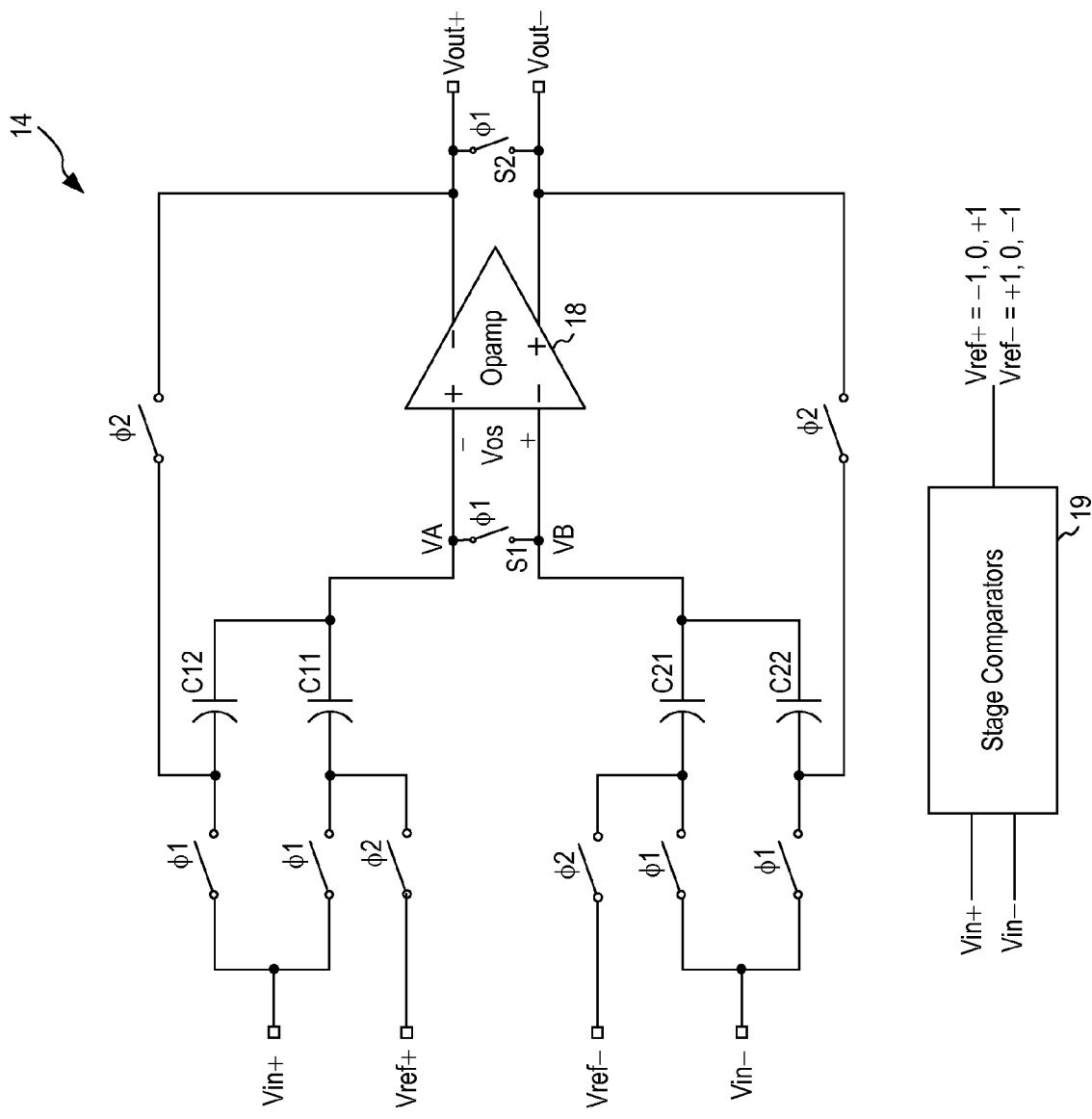
FIG. 2 is a circuit diagram illustrating a conventional 1.5-bit pipeline data conversion stage.
Figure 4:
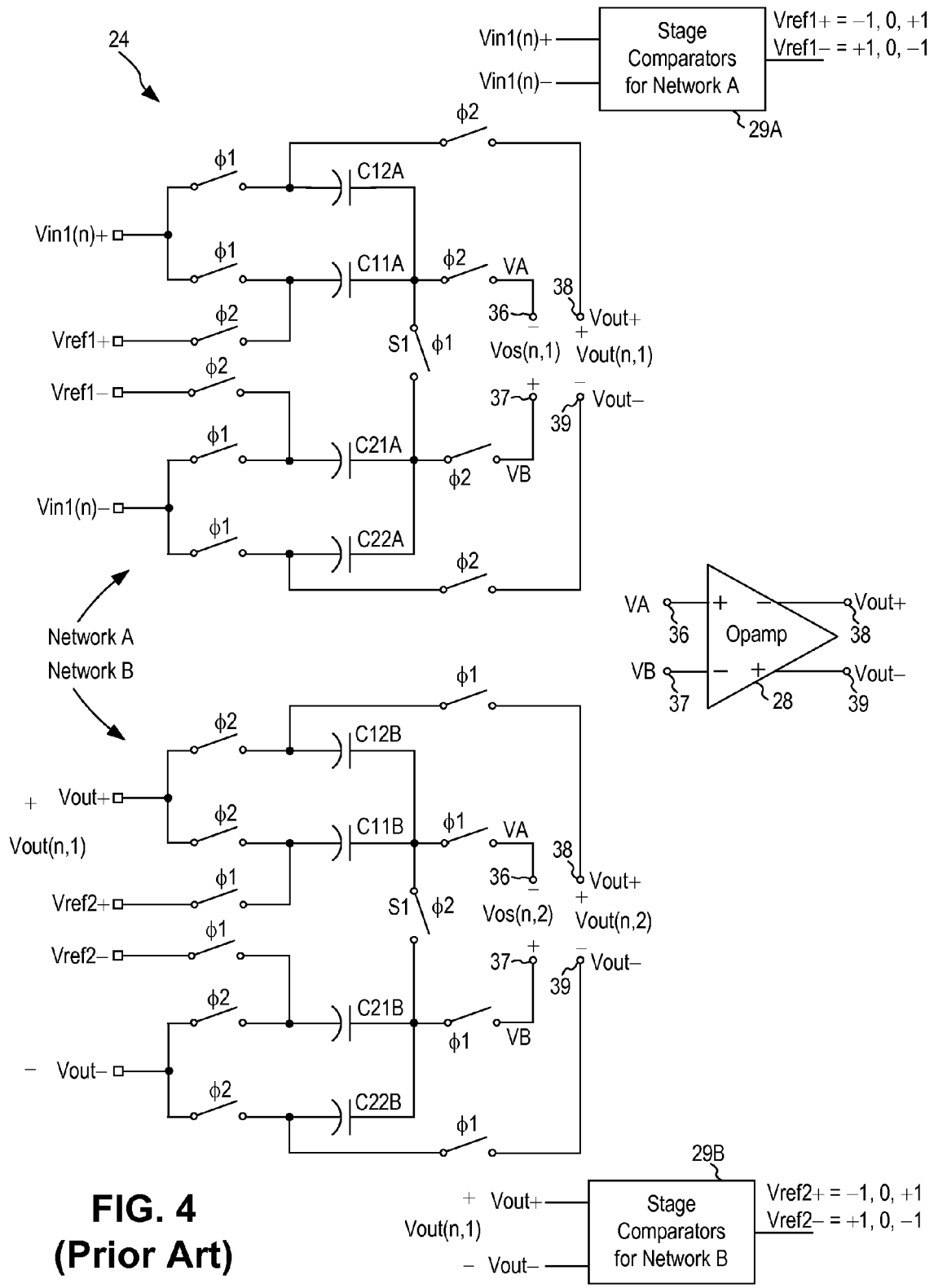
FIG. 4 is a circuit diagram illustrating a conventional opamp-shared 1.5-bit pipeline data conversion stage.
Figure 5A:
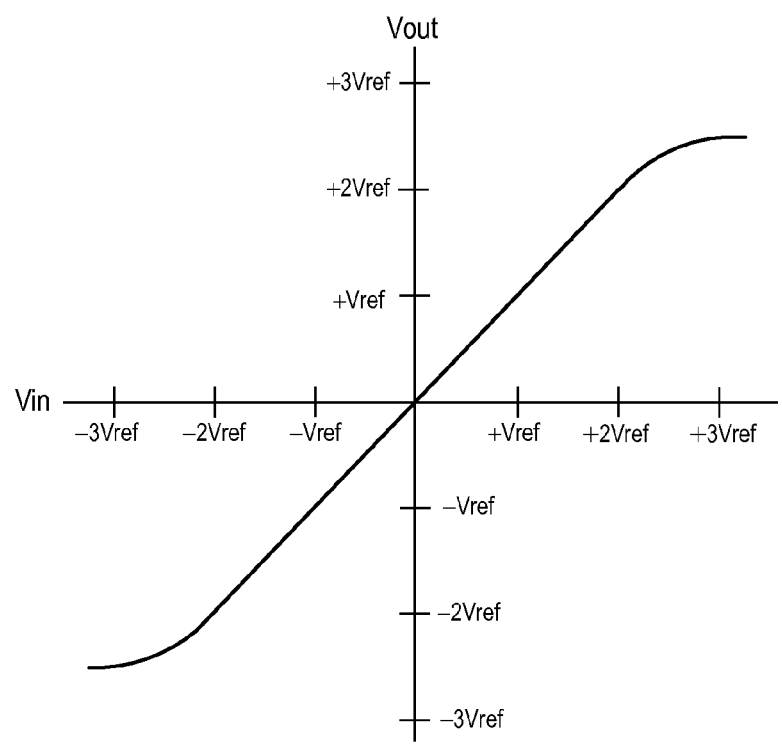
FIG. 5A illustrates a typical transfer function of an opamp normalized to the ADC reference range.
Figure 5B:
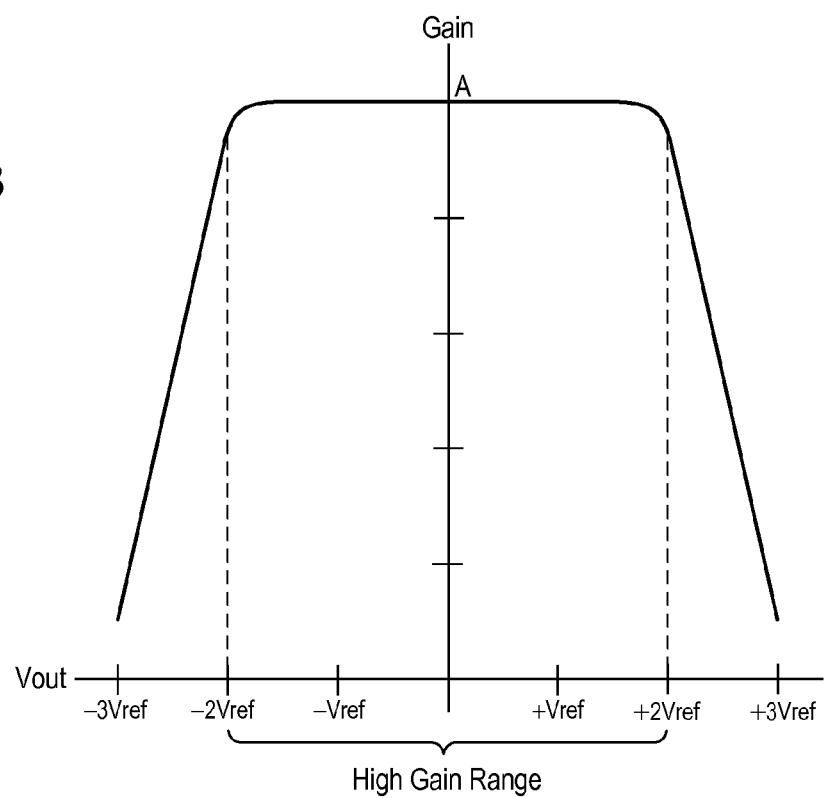
FIG. 5B illustrates the typical behavior of the open-loop gain A of an opamp over the output voltage range.
Figure 9:
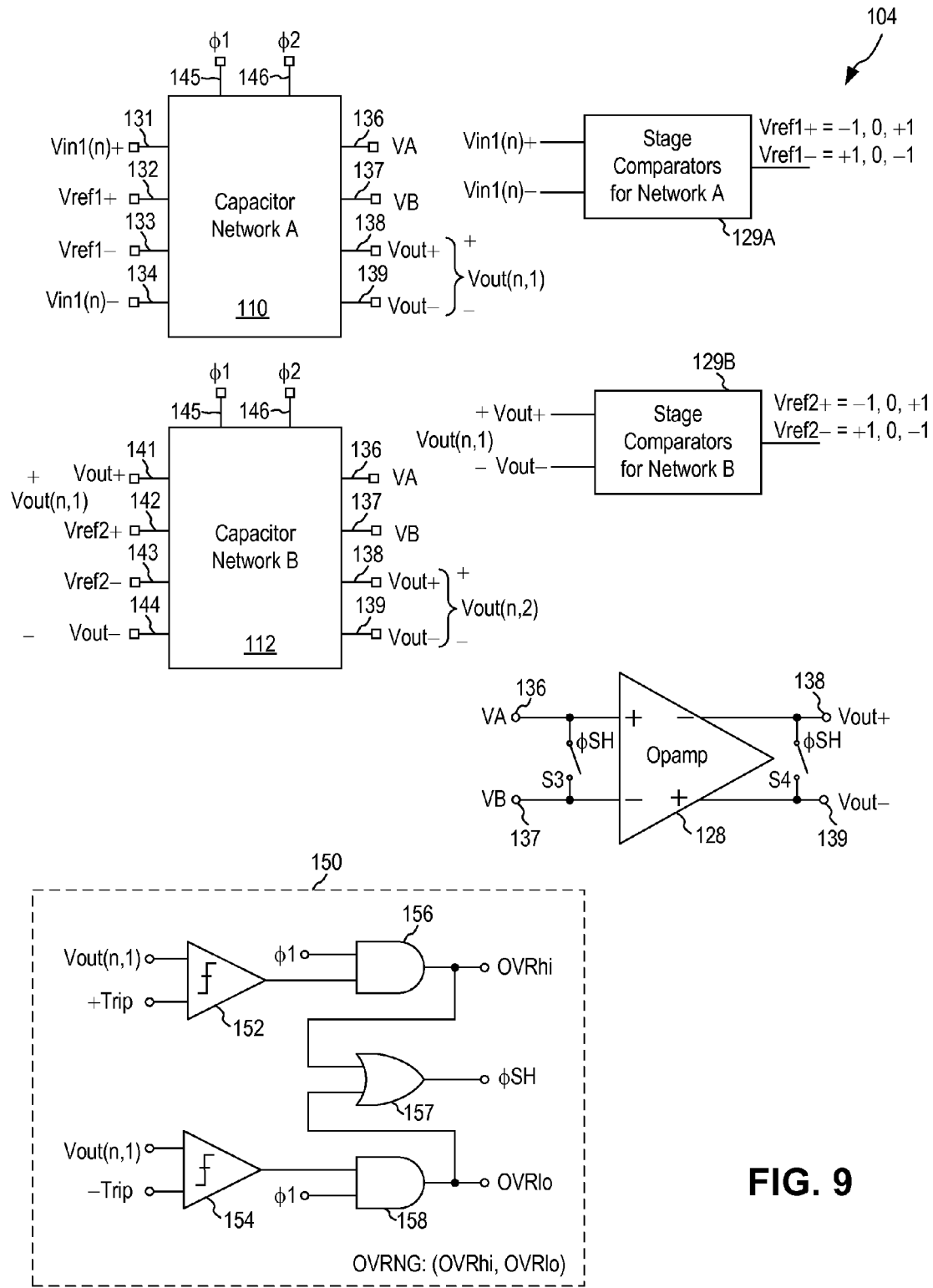
FIG. 9 is a schematic diagram illustrating an opamp-shared 1.5-bit pipeline data conversion stage implementing the over-range recovery scheme according to one embodiment of the present invention.

FIG. 9 is a schematic diagram illustrating an opamp-shared 1.5-bit pipeline data conversion stage implementing the over-range recovery scheme according to one embodiment of the present invention. Referring to FIG. 9, the construction of opamp-shared data conversion stage 104 is similar to data conversion stage 24 of FIG. 4 except with the inclusion of the over-range detection and recovery circuit, switches S3 and S4 and logic circuit 150. The basic construction of opamp-shared data conversion stage 104 will be described first, followed by the description of the over-range detection and recovery circuit.

Figure 10:
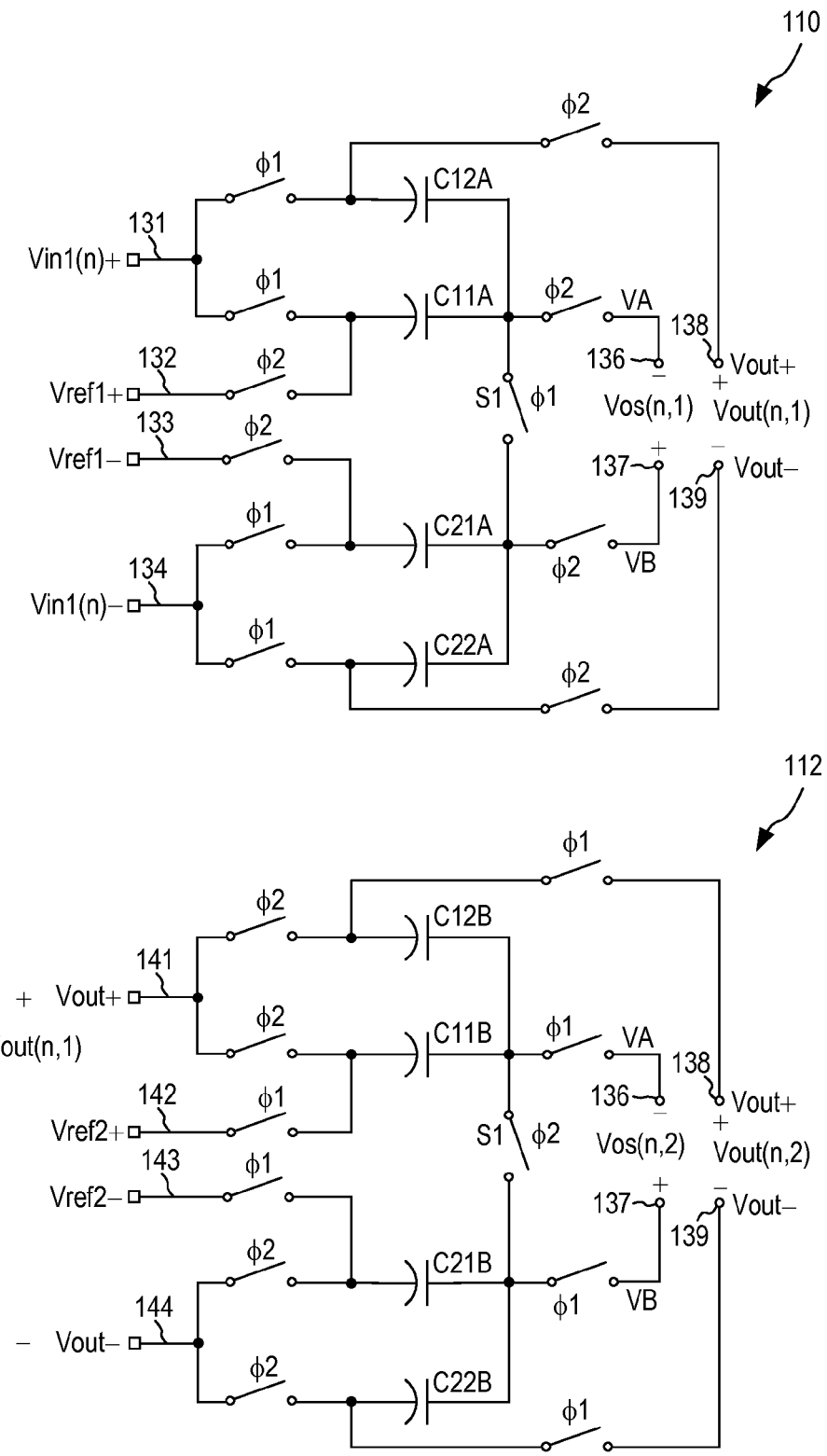
FIG. 10 is a circuit diagram illustrating the construction of the first and second input capacitor networks of the opamp-shared data conversion stage of FIG. 9 according to one embodiment of the present invention.

Referring to FIG. 9, opamp-shared data conversion stage 104 includes a first input capacitor network 110 (Network A) and a second input capacitor network 112 (Network B) a single opamp 128. Network A and Network B are each associated with a respective set of stage comparators 129A and 129B for selecting one of several reference voltages to be provided to the respective input capacitor network as voltages Vref1+/− and Vref2+/−. More specifically, stage comparators 129A operate on input voltages Vin1($n$)+/− provided to Network A and select a reference voltage value indicative of a −1, 0 or +1 logical value for each of voltage Vref1+ and voltage Vref1− for Network A. Meanwhile, stage comparators 129B operate on voltages Vout+/− provided as input voltages to Network B and select a reference voltage value indicative of a −1, 0 or +1 logical value for each of voltage Vref2+ and voltage Vref2− for Network B. The detail construction of input capacitor networks 110 and 112 is shown in FIG. 10.

Opamp-shared conversion stage 104 operates on two clock phases φ1 and φ2 to successively resolve two sets of bits of output signals within one data conversion stage.

The two clock phases include a first clock phase where clock φ1 is active and a second clock phase where clock φ2 is active. During the first clock phase (φ1), the first input capacitor network (Network A) samples its input voltage Vin1($n$)+/− while the second input capacitor network (Network B) processes its input voltages first residue Vout(n,1) into second residue Vout(n,2). Then, during the second clock phase (φ2), the first input capacitor network (Network A) processes the sampled voltages Vin1($n$)+/− into first residue Vout(n,1) while the second input capacitor network (Network B) samples the first residue as its input voltage. The conversion cycle repeats by returning to the first clock phase.

The operation of the opamp-shared data conversion stage 104 will now be described in detail with reference to FIGS. 9 and 10. It is assumed the input voltages are within the reference voltage range. During the previous second clock phase (φ2), the input voltage Vin1(n) has been processed into a first residue Vout(n,1) by Network A (110) and the first residue Vout(n,1) of network A has already been sampled by network B (112). Then, during the next first clock phase when clock φ1 is active, capacitors C11A, C12A, C21A and C22A of network A sample the input signal Vin1(n+1) which is the next sample of the conversion cycle. Meanwhile, capacitors C12B and C22B of network B are connected in a feedback configuration around opamp 128 and capacitors C11B and C21B are connected to respective reference voltages Vref2+/Vref2− to process the first residue Vout(n,1) from network A into a second residue Vout(n,2) at network B. At the end of the first clock phase (φ1), opamp 128 generates an output voltage Vout(n,2) being the second residue for the "nth" sample of the conversion cycle. Meanwhile, network A has sampled the next sample (n+1) onto the input capacitors.

During the second clock phase (φ2), capacitors C12A and C22A are connected in a feedback loop around opamp 128 while capacitors C11A and C21A are coupled to respective reference voltages Vref1+/−. Meanwhile, capacitors C11B, C12B, C21B and C22B are coupled to sample the first residue value Vout(n+1,1) generated by network A. As a result of connecting the capacitors of network A in a feedback loop configuration around opamp 128, first residue Vout(n+1,1) is generated as the residue of sampled input voltage Vin1(n+1).

During the first clock phase (φ1), an offset voltage Vos (n,2) appears between nodes VA and VB due to the operation of Network B. The offset voltage Vos(n,2) is inversely proportional to the gain of opamp 128. The offset voltage Vos(n,2) between nodes VA and VB is not erased because opamp 28 does not get reset. Instead, the offset voltage Vos(n,2) will remain between nodes VA and VB at the end of the first clock phase and into the subsequently second clock phase. During the second clock phase (φ2), an offset voltage Vos(n+1,1) appears between nodes VA and VB due to the operation of Network A. Offset voltage Vos(n+1,1) will add to residue Vout(n+1,2) in the same way offset voltage Vos(n,2) was added to residue Vout(n+1,1).

In accordance with one embodiment of the present invention, opamp-shared data conversion stage 104 incorporates an over-range detection and recovery circuit for implementing one-cycle absolute over-range recovery. In the present embodiment, the over-range detection and recovery circuit includes a switch S3 coupled across the input terminals VA, VB of opamp 128, a switch S4 coupled across the output terminals 138, 139 (Vout+, Vout−) of opamp 128 and a logic circuit 150. Logic circuit 150 receives the first residue value Vout(n,1) generated by the first input capacitor network (Network A) and a set of trip point voltage levels +Trip/−Trip. The set of trip point voltage levels +Trip/−Trip defines the allowed over-range voltage range. Logic circuit 150 monitors the input voltage of the second input capacitor network (Network B) and determines if the input voltage (Vout(n,1)) exceeds the allowed over-range voltage range. Logic circuit 150 generates the over-range indicator OVRNG and also the clock signal φSH. Clock signal φSH controls switches S3 and S4. In response to the clock signal φSH being asserted, the input terminals of opamp 128 are shorted together and the output terminals of the opamp 128 are also shorted together. In this manner, opamp 128 is reset and any offset voltage that may be present across nodes VA and VB will be cancelled.

Logic circuit 150 includes a pair of comparators 152 and 154 for monitoring first residue Vout(n,1) and detecting an over-range condition. Comparator 152 receives the first residue Vout(n,1) from Network A and also the upper trip point limit +Trip. Comparator 154 receives the first residue Vout(n,1) from Network A and also the lower trip point limit −Trip. The output signals of comparators 152 and 154 are asserted when the voltage Vout(n,1) exceeds either the upper or the lower trip point limits. The output signal from comparator 152 is coupled to an AND gate 156 to be logically AND'ed with the first clock phase φ1. The output signal from comparator 154 is coupled to an AND gate 158 to be logically AND'ed with the first clock phase φ1. AND gate 156 generates an over-range high signal OVRhi while AND gate 158 generates an over-range low signal OVRlo. By gating the comparator output signals with clock phase φ1, the over-range high signal OVRhi and the over-range low signal OVRlo are active only during the clock phase φ1.

Logic circuit 150 also includes an OR gate 157 coupled to receive the OVRhi signal and OVRlo signal as the input signals. OR gate 157 generates the clock signal φSH being the logically OR of the OVRhi signal and the OVRlo signal. In this manner, clock signal φSH, when asserted, is only asserted during the first clock phase φ1.

The operation of the over-range detection and recovery circuit is as follows. During the second clock phase (φ2), the input voltage Vin1(n) previously sampled onto the input capacitors C11A, C12A, C21A and C22A of Network A (110) is processed into first residue Vout(n,1). Meanwhile, the input capacitors C11B, C12B, C21B and C22B of Network B (112) are configured to sample the first residue Vout(n,1) of network A. At this time, comparators 152 and 154 of logic circuit 150 monitor the first residue Vout(n,1) and determine if an over-range condition exists.

Then during the first clock phase (φ1), Network A (110) is coupled to sample the next sample Vin1(n+1). Meanwhile, Network B (112) is configured to process the first residue Vout(n,1) into second residue value Vout(n,2). If logic circuit 150 determines that there is no over-range conditions, conversion stage 104 operates normally to generate second residue Vout(n,2). If one of comparators 152, 154 detects an over-range condition, the output signal of the asserted comparator passes through respective AND gate 156 or 158 to generate the respective over-range indicator signal OVRhi or OVRlo. Note that AND gates 156 and 158 acts as pass gates when the first clock signal φ1 is asserted. The clock signal φSH is then asserted to close switches S3 and S4. The opamp input terminals and the opamp output terminals are then shorted out.

Shorting of the opamp input terminals (nodes VA, VB) resets the offset voltage Vos(n,2) to zero during the first clock phase while shorting of the opamp input terminals Vout+/Vout−sets the second residue value Vout(n,2) to zero. By setting the offset voltage Vos(n,2) to zero, the over-range condition detected at sample "n" will not cause errors to be introduced to the next sample being sampled by Network A. By setting the output voltage Vout(n,2) to zero, the subsequent pipeline stages after the present conversion stage will not even be aware that an over-range condition has occurred and the subsequent pipeline stages are thus protected from over-range conditions.

The signals OVRhi and OVRlo from logic circuit 150 form the over-range indicator signal OVRNG and is provided to the digital decode logic block 106 (FIG. 6) to indicate that sample "n" has an over-range condition.

In one embodiment of the present invention, comparators 152 and 154 are implemented as switched-capacitor comparators. Switched-capacitor comparators have the advantage that the trip point voltage levels can be selected to be close to but remain outside of the reference voltage range.

In accordance with the present invention, comparators 152 and 154 compare the first residue value Vout(n,1) to a set of trip point voltage levels +Trip and −Trip. Trip point voltage levels +Trip and −Trip are outside of the reference voltage range but are within the high gain range of the opamp. Thus, first residue value Vout(n,1) that are outside of the reference voltage range but within the trip point range is allowed to be processed and amplified. When the residue value eventually exceeds the trip point range in subsequent conversion stages, the over-range detection and recovery circuit will then apply detection and correction.

In the present embodiment of the over-range detection and recovery circuit, the detection circuit monitors only the first residue value Vout(n,1) being coupled as the input voltage to Network B and shorting of the opamp is carried out only during the first clock phase (φ1). The present embodiment achieves circuit simplicity as it is not necessary to monitor the input voltage Vin(n) to the Network A and it is also not necessary to short out the opamp during the second clock phase (φ2). This is because the offset voltage Vos(n,1) from Network A will introduce an error during the processing of the second residue Vout(n,2). However, the error on second residue Vout(n,2) will be coupled to the next conversion stage and sampled by the next conversion stage as the "n" sample. Any over-range condition that may exist in the "n" sample will be detected in the subsequent conversion stages.

However, the offset voltage Vos(n,2) from Network B is more problematic as the offset voltage Vos(n,2), generated at the first clock phase (φ1) will introduce an error during the processing of the first residue Vout(n+1,1) at the subsequent second clock phase (φ2). Thus, an error in the offset voltage Vos(n,2) of the "n" sample will get transferred to the following "n+1" sample. Therefore, for over-range recovery concern, it is more important to not allow the offset voltage form one sample to be transferred to another sample. Thus, in the present embodiment, reset of the opamp due to over-range conditions occurs only during the first clock phase where offset voltage Vos(n,2) is generated.

By implementing the over-range detection and recovery scheme of the present invention, the opamp-shared conversion stage 104 will have negligible amount of offset voltage Vos(n,2) added to the first residue of the next sample Vout(n+1,1). One-cycle absolute over-range recovery in a shared opamp pipeline ADC is thus realized.

The above detailed descriptions are provided to illustrate specific embodiments of the present invention and are not intended to be limiting. Numerous modifications and variations within the scope of the present invention are possible. For instance, the over-range indicator signal OVRNG is optional and in some embodiments, it may not be necessary to bring the over-range indicator signal OVRNG out of the conversion stage to the digital decode logic block. Furthermore, one of ordinary skill in the art would appreciate that other logic gate combinations may be used to generate the clock signal φSH from the comparison results of comparators 152 and 154. The exact configuration of the logical gates in logic circuit 150 is not critical to the practice of the present invention. The present invention is defined by the appended claims.

We claim:

1. A data conversion stage circuit (104) for an opamp-shared pipeline analog-to-digital converter (ADC) (100), the data conversion stage circuit comprising first and second input capacitor networks (110, 112) switchably coupled to receive an input voltage and switchably coupled to an operational amplifier (opamp) (128) for sampling the input voltage and generating a first residue value related to the sampled input voltage during a second clock phase controlled by a second clock signal and a second residue value related to the first residue value during a first clock phase controlled by a first clock signal, the opamp having positive and negative input terminals (136, 137) and positive and negative output terminals (138, 139), the data conversion stage circuit comprising:

an over-range detection and recovery circuit comprising:
  a first switch (S3) connected between the positive and the negative input terminals (136, 137) of the opamp (128), the first switch being controlled by a first control signal and being closed when the first control signal is asserted;
  a second switch (S4) connected between the positive and the negative output terminals (138, 139) of the opamp (128), the second switch being controlled by the first control signal and being closed when the first control signal is asserted; and
  a logic circuit (150) coupled to receive the first residue value, a high comparison voltage level, and a low comparison voltage level and to generate the first control signal, the logic circuit comparing the first residue value to the high and low comparison voltage levels and asserting the first control signal during the first clock phase when the first residue value is either greater than the high comparison voltage level or less than the low comparison voltage level, wherein the high and low comparison voltage levels define a voltage region outside of a reference voltage range of the data conversion stage circuit, the reference voltage range defining in-range voltage values for the data conversion stage circuit.

2. The data conversion stage circuit of claim 1, wherein:
the first input capacitor network (110) is switchably coupled to sample the input voltage, switchably coupled in a feedback configuration around the opamp (128) and switchably coupled to receive a first reference voltage, the first input capacitor network is coupled to sample the input voltage during the first clock phase and is coupled in the feedback configuration and to the first reference voltage in the second clock phase, the opamp generating the first residue value for the sampled input voltage during the second clock phase; and the second input capacitor network (112) switchably coupled to sample the first residue value, switchably coupled in a feedback configuration around the opamp (128) and switchably coupled to receive a second reference voltage, the second input capacitor network is coupled to sample the first residue value during the second clock phase and is coupled in the feedback configuration and to the second reference voltage in the first clock phase, the opamp generating the second residue value for the sampled input voltage during the first clock phase.

3. The data conversion stage circuit of claim 2, further comprises:
  a first set of stage comparators (129A) selecting one of several voltage values for the first reference voltage based on the sampled input voltages; and
  a second set of stage comparators (129B) selecting one of several voltage values for the second reference voltage based on the first residue value.

4. The data conversion stage circuit of claim 1, wherein the logic circuit comprises:

a first comparator (152) receiving the first residue value and the high comparison voltage level, the first comparator providing a first output signal, the first output signal being asserted when the first residue value exceeds the high comparison voltage level;

a second comparator (154) receiving the first residue value and the low comparison voltage level, the second comparator providing a second output signal, the second output signal being asserted when the first residue value is lower than the low comparison voltage level; and one or more logic gates coupled to receive the first and second output signals and the first clock signal, the one or more logic gates generating the first control signal, the first control signal being asserted during the first clock phase when either the first output signal or the second output signal is asserted.

5. The data conversion stage circuit of claim 4, wherein the one or more logic gates of the logic circuit further provides a first over-range indicator signal and a second over-range indicator signal, the first over-range indicator signal being asserted during the first clock phase when the first output signal is asserted, and the second over-range indicator signal being asserted during the first clock phase when the second output signal is asserted.

6. The data conversion stage circuit of claim 5, wherein the one or more logic gates of the logic circuit comprises:
   a first logic gate (156) receiving the first output signal and the first clock signal and providing an AND function, the first logic gate generating the first over-range indicator signal;
   a second logic gate (158) receiving the second output signal and the first clock signal and providing an AND function, the second logic gate generating the second over-range indicator signal; and
   a third logic gate (157) receiving the first and second over-range indicator signals and providing an OR function, the third logic gate generating the first control signal.

7. The data conversion stage circuit of claim 4, wherein the first and second comparators (152, 154) comprise switched-capacitor comparators.

8. The data conversion stage circuit of claim 1, wherein the opamp (128) has a predetermined high gain range and the high and low comparison voltage levels define a voltage region outside of the reference voltage range and inside of the high gain range of the opamp.

9. A method in a data conversion stage (104) of an opamp-shared analog-to-digital converter (100), the method comprising:
   sampling an input voltage at a first input capacitor network (110) and generating a second residue value of a sampled first residue value at an operational amplifier (opamp) (128) during a first clock phase controlled by a first clock signal;
   generating a first residue value of the input voltage at the opamp and sampling the first residue value at a second input capacitor network (112) during a second clock phase controlled by a second clock signal;
   comparing the first residue value to a high comparison voltage level;
   comparing the first residue value to a low comparison voltage level, wherein the high and low comparison voltage levels define a voltage region outside of a reference voltage range of the data conversion stage circuit, the reference voltage range defining in-range voltage values for the data conversion stage circuit;
   asserting a control signal during the first clock phase when the first residue value is greater than the high comparison voltage level or less than the low comparison voltage level;
   shorting input terminals of the opamp together in response to the control signal being asserted; and
   shorting output terminals of the opamp together in response to the control signal being asserted.

10. The method of claim 9, further comprising:
    generating a first over-range indicator signal, the first over-range indicator signal being asserted during the first clock phase when the first residue value is greater than the high comparison voltage level; and
    generating a second over-range indicator signal, the second over-range indicator signal being asserted during the first clock phase when the first residue value is less than the low comparison voltage level.

11. The method of claim 9, wherein the opamp has a predetermined high gain range and the high and low comparison voltage levels define a voltage region outside of the reference voltage range and inside of the high gain range of the opamp.

* * * * *